United States Patent [19]

Stuhlmiller

[11] Patent Number: 4,567,384

[45] Date of Patent: Jan. 28, 1986

[54] VOLTAGE OFFSET PRODUCING CIRCUIT FOR USE WITH A LINE RECEIVER OR THE LIKE

[75] Inventor: Gary L. Stuhlmiller, Mesa, Ariz.

[73] Assignee: Motorola, Inc., Schaumburg, Ill.

[21] Appl. No.: 453,387

[22] Filed: Dec. 27, 1982

[51] Int. Cl.$^4$ ............... H03K 19/007; H03K 19/092
[52] U.S. Cl. ........................ 307/442; 307/297;
307/443; 307/491; 330/261
[58] Field of Search ............ 307/442, 443, 542, 544,
307/303, 304, 549, 551, 296 R, 297, 475, 553,
491, 292; 330/261

[56] References Cited

U.S. PATENT DOCUMENTS

| | | | |
|---|---|---|---|
| 3,582,681 | 6/1971 | Norman | 307/562 X |
| 3,656,003 | 4/1972 | Chen et al. | 307/551 X |
| 4,166,983 | 9/1979 | Lacroix | 330/261 X |
| 4,258,331 | 3/1981 | Nakayama | 330/261 |
| 4,308,470 | 12/1981 | Regnier | 307/443 X |
| 4,395,681 | 7/1983 | Hornung et al. | 330/261 X |
| 4,532,479 | 7/1985 | Blauschild | 330/261 |

Primary Examiner—Stanley D. Miller
Assistant Examiner—David R. Bertelson
Attorney, Agent, or Firm—Michael D. Bingham

[57] ABSTRACT

A circuit which may be utilized with a EIA RS 422/423 line receiver to guarantee that the output of the receiver goes to a known output logic stage when there is no signal supplied at the input thereof. The circuit comprises a pair of substantially indentical transistor circuits coupled in parallel between a power supply bus. One transistor of a particular one of the transistor circuits is fabricated with a smaller emitter area with respect to its counterpart transistor in the other transistor circuit. Thus, a voltage difference is established between the emitter contacts of the two transistors which produces the voltage offset. This voltage offset is utilized to dirve the output of the line receiver to said output state absence an input signal supplied to the receiver.

9 Claims, 1 Drawing Figure

U.S. Patent  Jan. 28, 1986  4,567,384
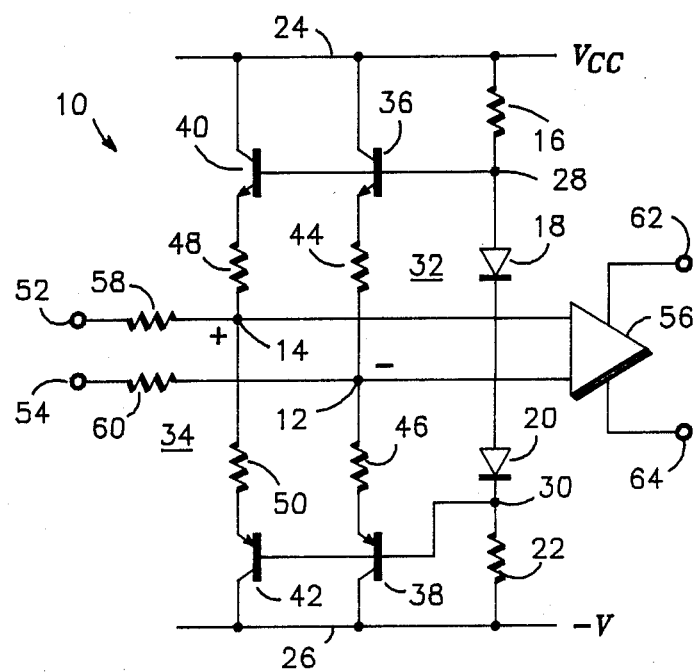

VOLTAGE OFFSET PRODUCING CIRCUIT FOR USE WITH A LINE RECEIVER OR THE LIKE

BACKGROUND OF THE INVENTION

Data transmission line receivers for use in EIA RS422/423 applications are well known. Typically, a line receiver is operated from a single power supply to receive the transmission of digital data on a differential, balanced twisted-pair transmission line. The line receiver generally includes a differential amplifier having a pair of inputs coupled to inputs of the line receiver through an attenuation circuit.

A problem can arise, due to input signal failure, which may cause the output of the line receiver to oscillate. This is undesirable because the oscillations may be treated by the end user equipment which is connected with the line receiver as digital data to create erroneous information. The signal failure may happen, for example, by the input to the line receiver being either open or short circuited.

Hence, there arises a need for providing a fail safe circuit which can guarantee that the output of the line receiver will go to a predetermined output state if the input thereof is either open or short circuited to thereby inhibit oscillations at the output of the receiver.

In addition, it is desirable to provide a fail safe circuit which allows the use of a termination resistance for matching of the receiver to the transmission line while providing the aforementioned fail safe feature.

SUMMARY OF THE INVENTION

Accordingly, it is an object of the present invention to provide an improved circuit for producing a voltage offset between first and second outputs thereof.

Another object of invention is to provide a fail safe circuit for use with EIA RS422/423 type line receivers.

Still another object of the invention is to provide a fail safe circuit for use with line receivers utilized in EIA RS422/423 applications that guarantees the output of the line receiver will go to a known output logic state whenever there is no signal at the input thereof.

In accordance with the above and other objects, there is provided a circuit for producing a voltage offset between first and second outputs thereof, comprising first transistor circuit means for producing a voltage of a first magnitude at the first output; and second transistor circuit means coupled in parallel to said first transistor circuit means for producing a voltage of a second magnitude at the second output of the circuit.

A feature of the invention is that the above described circuit can be used in the attenuation input stage of a line receiver the type aforementioned to guarantee that the output of the line receiver goes to a known logic output state when there is no signal at the input of the line receiver.

BRIEF DESCRIPTION OF THE DRAWING

The single feature is a schematic illustrating the voltage offset producing circuit of the preferred embodiment.

DETAILED DESCRIPTION OF THE PREFERRED EMBODIMENT

Turning to the single FIGURE there is shown fail safe circuit 10 of the present invention which is suited to be manufactured in monolithic integrated circuit form and which, in the preferred embodiment, may be utilized in the input stage of a line receiver for guaranteeing that the output of the line receiver goes to a known logic output state when there is no signal applied at the input thereof. Fail safe circuit 10 produces a voltage offset between output nodes 12 and 14 as will be later explained. A bias circuit including resistor 16, diode 18, diode 20 and resistor 22 connected in series in the order mentioned between first and second power supply conductors 24 and 26 produces first and second bias signals at output nodes 28 and 30. By matching of the circuit elements of the bias circuit, the center point between diodes 18 and 20 is at a voltage level $$(V_{CC}+V)/2 \tag{1}$$

Thus, the bias signals appearing at the outputs 28 and 30 are at a known voltage level.

A pair of transistor circuits 32 and 34 are coupled between the power supply conductors to the outputs 28 and 30 of the bias circuit which establishes the voltage levels appearing at nodes 12 and 14. Each of the transistor circuits include a pair of transistors 36, 38: 40, 42 respectively having the emitters thereof interconnected through respective series connected resistors 44, 46: 48, 50. The collectors of each pair of transistors are connected between the respective power supply conductors with output nodes 12 and 14 being connected between the series connected resistors of the particular transistor circuit. The base electrodes of transistors 36 and 40 are connected to output 28 of the bias circuit. Likewise, the base electrodes of transistors 38 and 42 are connected to output 30 of the bias circuit.

Resistors 44, 46, 48 and 50 are matched and are of equal resistance value. If the transistors of the respective transistor circuits were matched and had equal geometries, the voltage levels appearing at nodes 12 and 14 (assuming no input signal at inputs 52 and 54) would be substantially identical, i.e. equal to the value of $(V_{CC}+V)/2$. However, the emitter area of transistor 42, in the preferred embodiment, is made less than the emitter area of transistor 38 wherein the emitter contact potential of the former is therefore greater than that of the latter. Hence, a predetermined voltage offset of the polarity shown is produced between nodes 12 and 14.

A feature of the present invention is that circuit 10 can be utilized in the attenuation input stage of a line receiver to guarantee that the output of the line receiver goes to a predetermined logic output stage when there is no signal applied at the input of the receiver. As illustrated, a typical line receiver includes a differential amplifier 56 having differential inputs coupled through an attenuation circuit comprising resistors 58 and 60 to inputs 52 and 54 of the line receiver. The differential amplifier 56 has outputs 62 and 64 which drive further stages of the receiver (not shown). For example, the MC3486 is an monolithic integrated line receiver circuit of the type referred to which is manufactured by Motorola, Inc. in which fail safe circuit 10 can be utilized.

In operation, as long as there is digital data transmission signals supplied to inputs 52 and 54, the offset voltage produced between terminals 12 and 14 is overridden and the line receiver will function in a normal manner. However, when there is no signal appearing at inputs 52 and 54, the voltage offset produced by circuit 10, at terminals 12 and 14, is sufficient in magnitude to drive one of the outputs of differential amplifier 56 to a high output state which, in turn, causes the output of the line receiver to go to a predetermined output logic state to indicate a signal failure.

The circuit structure of fail safe circuit 10 is such that a termination resistor, for example, typically 200 ohms can be placed across input terminals 52 and 54. This allows the twisted pair transmission line to be terminated in its characteristic impedance for maximum transfer of energy.

Hence, what has been described above is a novel circuit that provides a predetermined amount of voltage offset between a pair of output terminals and which is suited to be utilized in a line receiver circuit to guarantee that the output of the line receiver will go to a predetermined output logic state whenever there is signal failure at the input thereof.

I claim:

1. Circuit for providing a voltage offset between first and second terminals, comprising first and second power supply conductors, bias circuit means coupled between said first and second power supply conductors and having first and second outputs at which first and second bias signals are provided respectively, first and second transistor circuit means each includes a first transistor and a second transistor of different conductivity type than said first transistor, said first and second transistors each having first, second and control electrodes, said control electrodes of said first and second transistors being coupled respectively to said first and second outputs of said bias circuit means, said first electrodes of said first and second transistors of said first transistor circuit means being coupled to the first terminal, said first electrodes of said first and second transistor of said second transistor circuit means being coupled to the second terminal, said second electrodes of each of said first transistors being coupled to said first power supply conductor, and said second electrodes of each of said second transistors being coupled to said second power supply conductor.

2. The circuit of claim 1 wherein:
said second transistors are bipolar transistors and said second transistor of said first transistor circuit means having an emitter area different from the emitter area of said second transistor of said second transistor circuit means; and
each of said first and second transistor circuit means include resistive circuit means coupled between said first electrodes of said first and second transistors thereof.

3. A fail safe circuit for use in a monolithic integrated line receiver circuit for producing an offset voltage between first and second nodes sufficient to switch the output of the line receiver circuit to a predetermined logic level state whenever there is no input signal applied to the respective inputs of the line receiver, the first and second nodes being coupled respectively to the inputs of the line receiver, comprising:
bias circuit means for producing first and second bias signals respectively; and
first and second transistor circuit means each receiving said first and second bias signals and being connected in a parallel configuration, said first transistor circuit means producing a first voltage of a first magnitude at the first node in the absence of the input signal, said second transistor circuit means producing a second voltage of a second magnitude that is less than said first magnitude at the second node in the absence of the input signal wherein the offset voltage is established.

4. The circuit of claim 3 wherein said first and second transistor circuit means each include a first transistor and a second transistor of different conductivity type as said first transistor, the base electrodes of said first and second transistors receiving, respectively, said first and second bias signals, the collector electrodes of both said first transistors being coupled to a first power supply conductor, the collector electrodes of both said second transistors being coupled to a second power supply conductor, the emitter electrodes of said first and second transistors of said first transistor circuit means being coupled to the first node and the emitter electrodes of said first and second transistors of said second transistor circuit means being coupled to the second node.

5. The circuit of claim 4 wherein:
the emitter area of said second transistor of said first transistor circuit means is different than the emitter area of said second transistor of said second transistor circuit means; and
each of said first and second transistor circuit means includes resistive circuit means coupled between said emitters of said first and second transistors thereof.

6. In a monolithic integrated line receiver circuit including an attenuation input circuit, a fail safe circuit having first and second outputs coupled respectively to first and second nodes of the attenuation circuit for producing an offset voltage therebetween sufficient to cause the output of the line receiver to go to a predetermined logic level state when there is no signal applied to the inputs of the line receiver; comprising:
bias circuit means for producing first and second direct current bias signals; and
first and second transistor circuit means each receiving said first and second direct current bias signals and being connected in a parallel configuration, said first transistor circuit means producing a first voltage of a first magnitude at the first node, said second transistor circuit means producing a second voltage of a second magnitude that is less than said first magnitude at the second node wherein the offset voltage is produced.

7. The circuit of claim 6 wherein said first and second transistor circuit means each include a first transistor and a second transistor of different conductivity type to said first transistor, the base electrodes of said first and second transistors receiving, respectively, said first and second bias signals, the collector electrodes of both said first transistors being coupled to a first power supply conductor, the collector electrodes of both said second transistors being coupled to a second power supply conductor, the emitter electrodes of said first and second transistors of said first transistor circuit means being coupled to the first node and the emitter electrodes of said first and second transistors of said second transistor circuit means being coupled to the second node.

8. The circuit of claim 7 wherein:
the emitter area of said second transistor of said first transistor circuit means is of different size with respect to the emitter area of said second transistor of said second transistor circuit means; and
each of said first and second transistor circuit means includes resistive circuit means coupled between said emitters of said first and second transistors thereof.

9. A circuit for providing a predetermined voltage offset between first and second terminals, comprising:
 bias circuit means for providing first and second direct current bias signals at first and second outputs thereof respectively;
 first transistor circuit means responsive to said first and second direct current bias signals for providing a substantially constant first voltage of a first magnitude and polarity of an output thereof, said output being connected to said first terminal; and
 second transistor circuit means responsive to said first and second direct current bias signals for providing a substantially constant second voltage of a second magnitude that is less than said first magnitude and polarity at an output thereof, said output being coupled to said second terminal, said polarity of said second voltage being like polarity as said first voltage.

* * * * *